(12) United States Patent
Hasegawa

(10) Patent No.: US 8,378,237 B2
(45) Date of Patent: Feb. 19, 2013

(54) MULTI-PIECE BOARD AND FABRICATION METHOD THEREFOR

(75) Inventor: Yasushi Hasegawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 748 days.

(21) Appl. No.: 12/537,713

(22) Filed: Aug. 7, 2009

(65) Prior Publication Data

US 2010/0118504 A1    May 13, 2010

(30) Foreign Application Priority Data

Nov. 10, 2008  (JP) ................................. 2008-288261

(51) Int. Cl.
*H01R 13/502* (2006.01)
*H01R 43/20* (2006.01)
(52) U.S. Cl. ......................................... 174/559; 29/876
(58) Field of Classification Search .................. 174/268, 174/559–564; 29/876–884
See application file for complete search history.

(56) References Cited

FOREIGN PATENT DOCUMENTS

| JP | 5-145203 | 6/1993 |
|----|----------|--------|
| JP | 2000-252605 | 9/2000 |
| JP | 2002-171034 | 6/2002 |
| JP | 2002-232089 | 8/2002 |
| JP | 2002-289986 | 10/2002 |
| JP | 2003-069190 | 3/2003 |
| JP | 2005-19693 | 1/2005 |
| JP | 2005-322878 | 11/2005 |
| JP | 2007-115855 | 5/2007 |
| JP | 2007-258532 | 10/2007 |

*Primary Examiner* — Jeremy Norris
(74) *Attorney, Agent, or Firm* — Oblon, Spivak, McClelland, Maier & Neustadt, L.L.P.

(57) ABSTRACT

A method for fabricating a multi-piece board includes: preparing a board main portion having a first coupling member and multiple piece portions connected to the first coupling member, the first coupling member forming a part of a coupling member of a multi-piece board, each of the piece portions having a printed wiring board; preparing a second coupling member which forms the coupling member together with the first coupling member; and adhering the second coupling member to the first coupling member of the board main portion, thereby yielding the multi-piece board.

20 Claims, 19 Drawing Sheets

MULTI-PIECE BOARD AND FABRICATION METHOD THEREFOR

CROSS REFERENCE TO RELATED APPLICATIONS

The present application claims the benefits of priority to Japanese Patent Application No. 2008-288261, which was filed on Nov. 10, 2008. The entire contents of Japanese Patent Application No. 2008-288261 are herein incorporated by reference.

BACKGROUND OF THE INVENTION

1. Field of the Invention

The present invention relates to a multi-piece board having a frame part as a coupling member and a plurality of piece parts each comprising a printed wiring board, and a method of fabricating the same.

2. Descriptions of Related Art

For example, Unexamined Japanese Patent Application Publication No. 2002-289986, Unexamined Japanese Patent Application Publication No. 2002-232089, Unexamined Japanese Patent Application Publication No. 2003-69190, Unexamined Japanese Patent Application Publication No. 2007-115855 and Unexamined Japanese Patent Application Publication No. 2005-322878 describe methods of fabricating multi-piece boards. Those multi-piece boards each has a frame part as a coupling member, and piece parts connected to the frame part. When a multi-piece board includes a defective piece, a user cuts out the defective piece from the frame and attaches a good (defect-free) piece thereto instead.

The contents of Unexamined Japanese Patent Application Publication No. 2002-289986, Unexamined Japanese Patent Application Publication No. 2002-232089, Unexamined Japanese Patent Application Publication No. 2003-69190, Unexamined Japanese Patent Application Publication No. 2007-115855 and Unexamined Japanese Patent Application Publication No. 2005-322878 are herein incorporated in their entirety.

SUMMARY OF THE INVENTION

According to the first aspect of the invention, a method for fabricating a multi-piece board, includes: preparing a board main portion having a first coupling member and multiple piece portions connected to the first coupling member, the first coupling member forming a part of a coupling member of a multi-piece board; preparing a second coupling member which forms the coupling member together with the first coupling member; and adhering the second coupling member to the first coupling member of the board main portion.

According to the second aspect of the invention, a multi-piece board includes: a board main portion having a first coupling member and a plurality of piece portions connected to the first coupling member, the first coupling member forming a part of a coupling member of a multi-piece board, the plurality of piece portions having a plurality of printed wiring board, respectively; and a second coupling member forming the coupling member together with the first coupling member and adhered to the first coupling member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTIONS OF THE EMBODIMENTS

Figure 1:
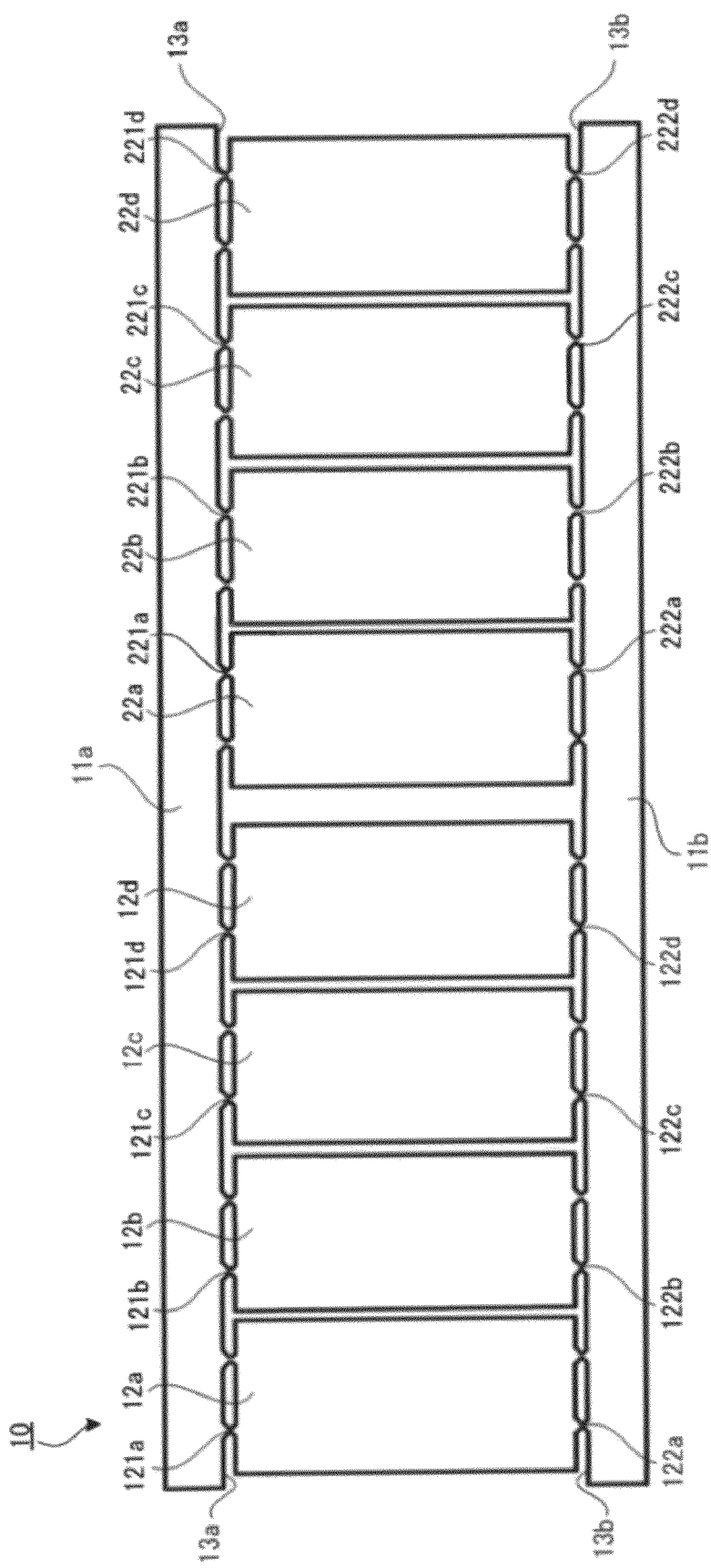
FIG. 1 is a plan view showing a multi-piece board to be fabricated.

The embodiments will now be described with reference to the accompanying drawings, wherein like reference numerals designate corresponding or identical elements throughout the various drawings.

First Embodiment

As shown in FIG. 1, for example, a multi-piece board 10 which is to be fabricated according to an embodiment has frame parts 11a and 11b as coupling portions, and piece parts 12a, 12b, 12c, 12d, 22a, 22b, 22c and 22d.

The frame parts 11a and 11b are two long bar-like parts sandwiching the successive piece parts 12a to 12d and 22a to 22*d*. The piece parts 12*a* to 12*d* and 22*a* to 22*d* are connected to one another via the frame parts 11*a* and 11*b*. The shape of the frame parts 11*a* and 11*b* is optional, and may be, for example, a parallelogram, circular or elliptical frame surrounding the piece parts 12*a* to 12*d* and 22*a* to 22*d*. The frame parts 11*a* and 11*b* are formed of, for example, an insulating material, which is optional.

Each of the piece parts 12*a* to 12*d* and 22*a* to 22*d* has a printed wiring board. Specifically, each of the piece parts 12*a* to 12*d* and 22*a* to 22*d* is a rectangular rigid printed wiring board. The rigid printed wiring board includes circuits of, for example, an electronic device. It is to be noted that the shape of the piece parts 12*a* to 12*d* and 22*a* to 22*d* is optional, and may be, for example, a parallelogram, circular or elliptical shape. The piece parts 12*a* to 12*d* and 22*a* to 22*d* are not limited to a rigid printed wiring board. For example, each piece part may be a flexible printed wiring board. As another example, each piece part may be a flex-rigid printed wiring board. In addition, each piece part may be a printed wiring board having an electronic part built therein. Further, each piece part may be a printed wiring board having a cavity formed in the top surface thereof. Those different types of printed wiring boards may be combined on a single multi-piece board 10. Further, in the combination of different types of printed wiring boards or the combination of printed wiring boards of the same type, a low-density printed wiring board and a high-density printed wiring board may be combined. The low-density printed wiring board is a printed wiring board having a lower wiring density than the high-density printed wiring board.

Slits 13*a* and 13*b* are formed between the frame part 11*a*, 11*b* and the piece parts 12*a* to 12*d* and 22*a* to 22*d*, excluding those portions of bridges 121*a* to 121*d* and 221*a* to 221*d* and bridges 122*a* to 122*d* and 222*a* to 222*d* as shown in FIG. 1. That is, the frame part 11*a* is connected to the piece parts 12*a* to 12*d* and 22*a* to 22*d* via the bridges 121*a* to 121*d* and 221*a* to 221*d*, respectively, while the frame part 11*b* is connected to the piece parts 12*a* to 12*d* and 22*a* to 22*d* via the bridges 122*a* to 122*d* and 222*a* to 222*d*, respectively.

The bridges 121*a* to 121*d* and 221*a* to 221*d*, and bridges 122*a* to 122*d* and 222*a* to 222*d* are formed of, for example, an insulating material, which is optional.

Figure 2:
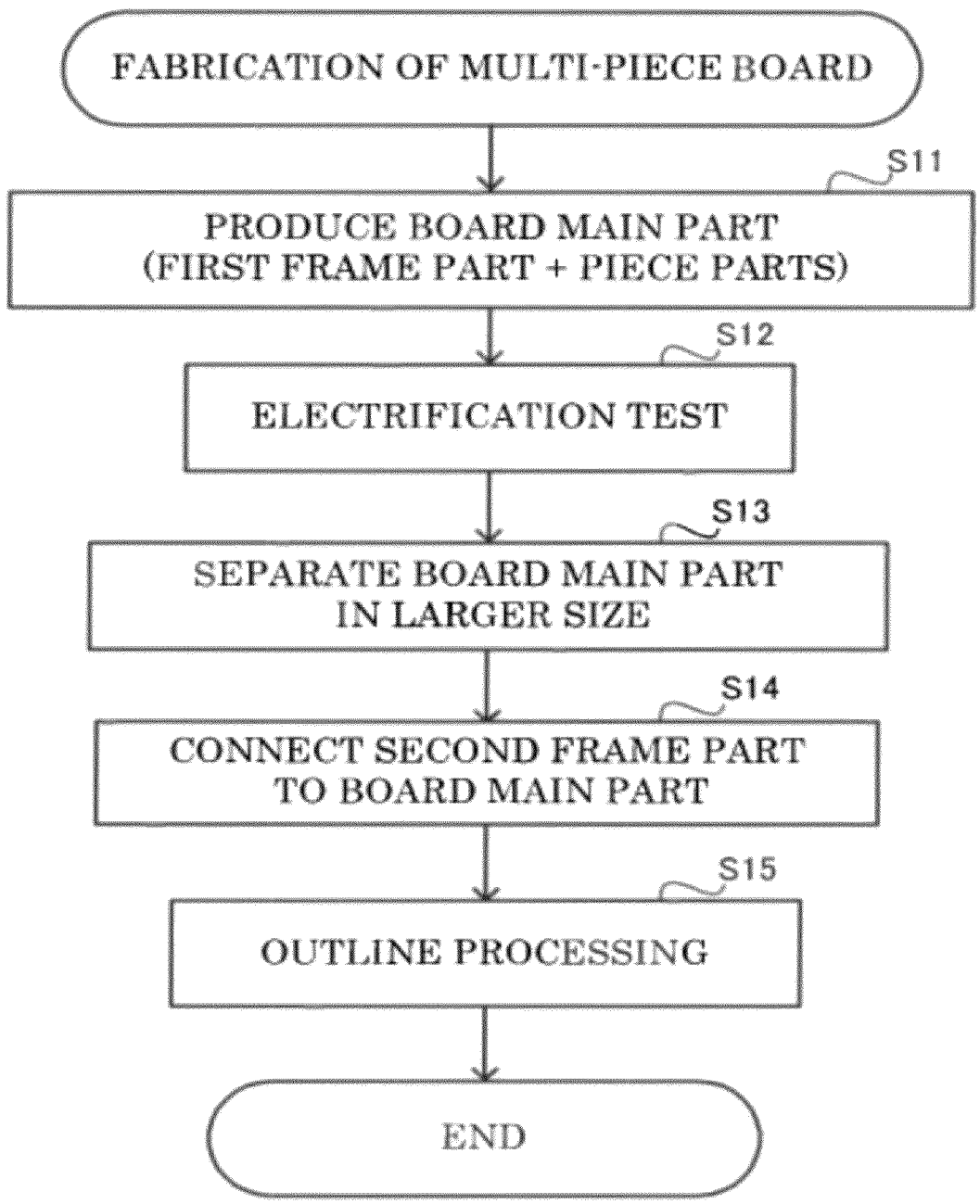
FIG. 2 is a flowchart illustrating procedures of the fabrication method for a multi-piece board according to a first embodiment of the invention.

In case of fabricating the multi-piece board 10, for example, a series of processes illustrated in FIG. 2 are carried out.

Figure 3A:
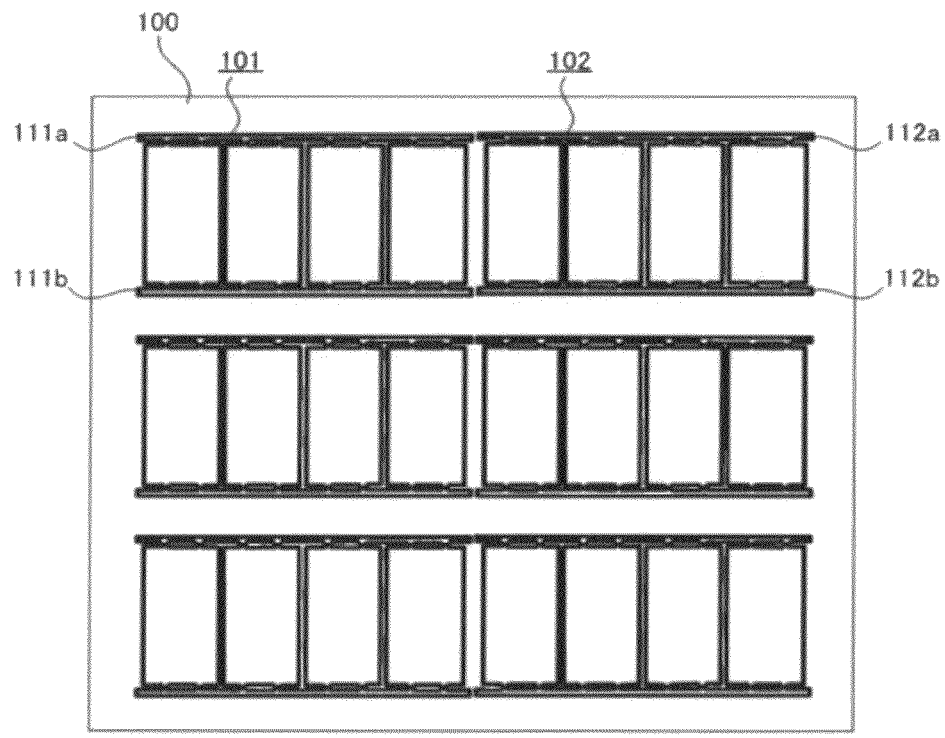
FIG. 3A is a diagram for explaining a step of producing a board main part at a first production panel.

First, in step S11, board main parts 101 and 102, equivalent to a part of the multi-piece board 10, are produced at a production panel 100, for example, as shown in FIG. 3A. While multiple (three or more) board main parts are produced at a single production panel 100 in the example of FIG. 3A, the quantity of board main parts to be produced may just be the number of board main parts in use, i.e., only two board main parts 101 and 102.

Figure 3B:
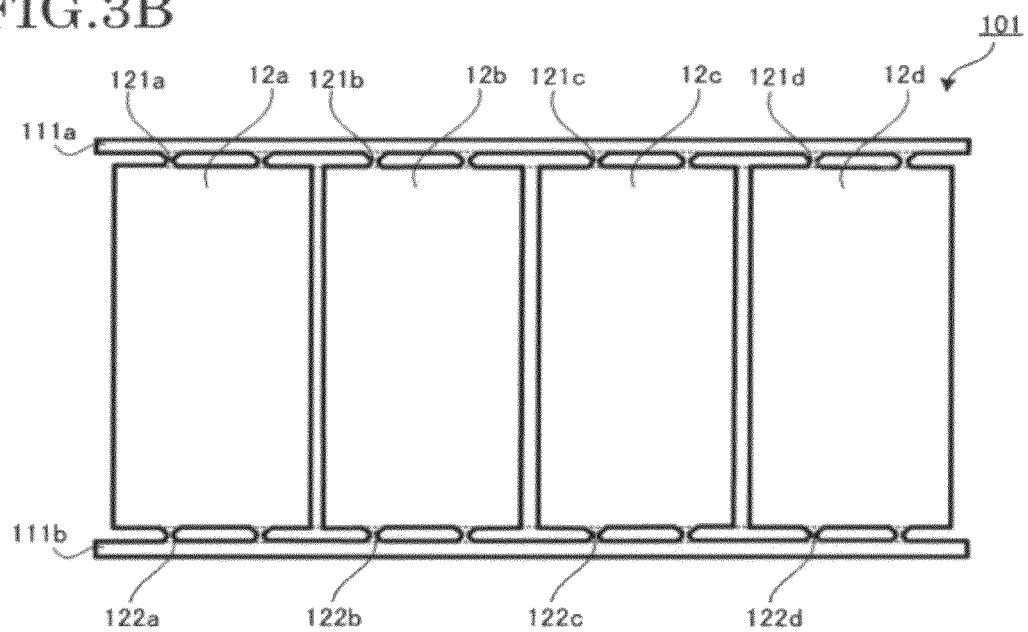
FIG. 3B is an enlarged view of the board main part.

The board main parts 101 and 102 respectively include first frame parts 111*a*, 111*b*, and 112*a*, 112*b* (first coupling members) equivalent to a part of the frame parts 11*a*, and 11*b*, piece parts 12*a* to 12*d*, and 22*a* to 22*d*, bridges 121*a* to 121*d*, and 221*a* to 221*d*, and bridges 122*a* to 122*d*, and 222*a* to 222*d*. As shown in FIG. 3B of the board main part 101 in enlargement, the first frame parts 111*a*, 111*b*, and 112*a*, 112*b* are equivalent to the lower end portions (piece-side long sides to be connected to the bridges) of the frame parts 11*a* and 11*b*. The designing of the first frame parts 111*a*, 111*b*, 112*a*, 112*b* smaller in size than the specified dimensions eliminates the need for the areas of the portions which contact the second frame parts, thus making it possible to increase the number of board main parts 101 and 102 yielded in the production panel per unit area.

The piece parts 12*a* to 12*d*, and 22*a* to 22*d* can be fabricated by laminating a prepreg impregnated with an uncured epoxy resin, polyimide resin, phenolic resin or the like on a base, such as a glass cloth, an unwoven cloth of aramid fibers, or paper, using a general fabrication method for, for example, a multilayer printed wiring board. The structure of the piece parts 12*a* to 12*d* and 22*a* to 22*d* is not limited to this particular type. Each of the piece parts 12*a* to 12*d* and 22*a* to 22*d* may be a printed wiring board acquired by alternately laminating wiring layers and insulation layers on, for example, a ceramic base.

The first frame parts 111*a*, 111*b*, and 112*a*, 112*b*, the bridges 121*a* to 121*d*, and 221*a* to 221*d*, and the bridges 122*a* to 122*d*, and 222*a* to 222*d* are formed by, for example, a silk screen technique, photolithography technique or the like.

Subsequently, in step S12, an electrification test is performed on the board main parts 101 and 102.

Figure 4:
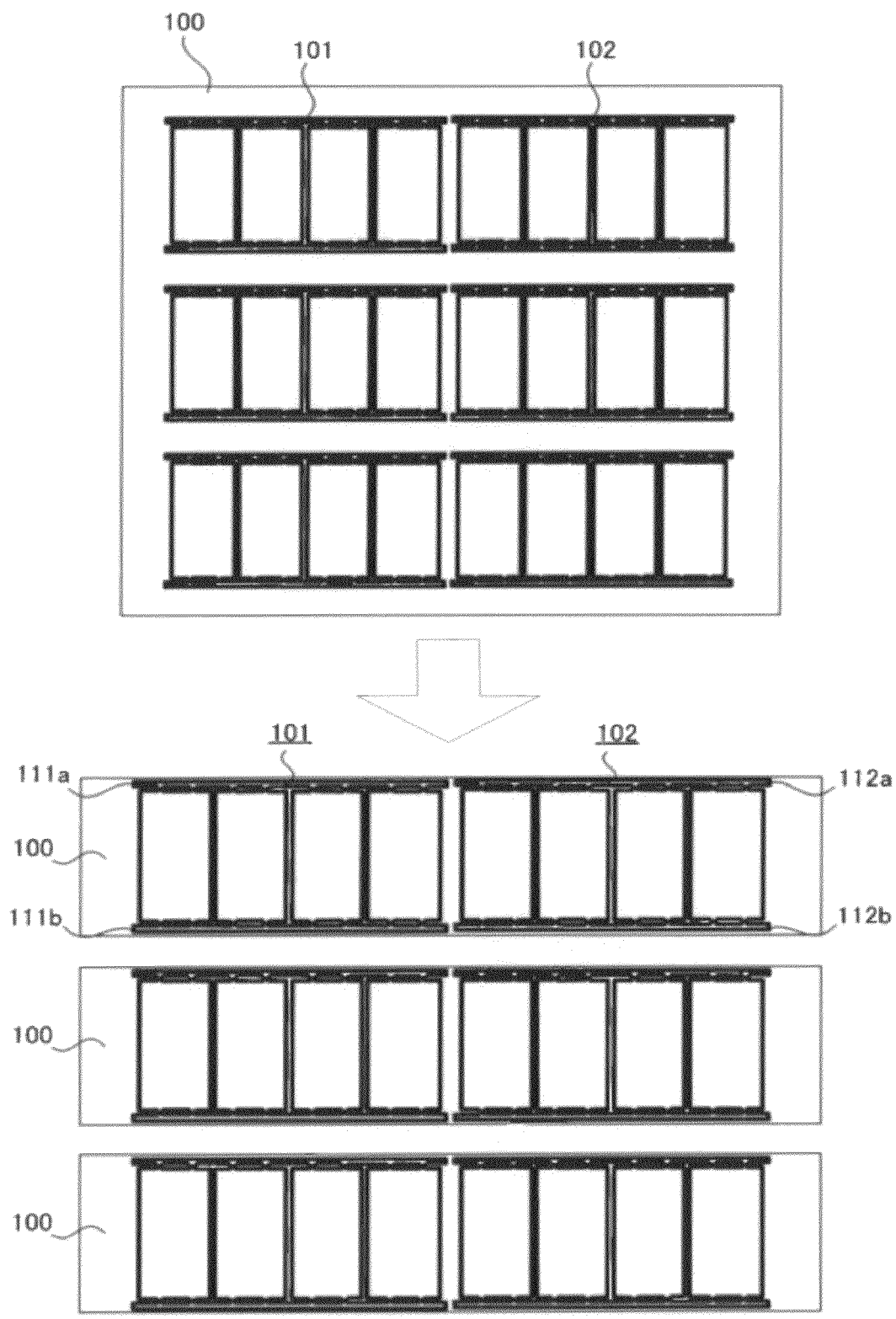
FIG. 4 is a diagram for explaining a step of separating the board main part from the first production panel.

In next step S13, the board main parts 101 and 102 in sizes larger than outside dimensions (design values) are separated with, for example, a dicing saw, dry saw, a router or the like, as shown in FIG. 4. At this time, as shown in FIG. 3B, the piece parts 12*a* to 12*d*, and 22*a* to 22*d* are coupled to the first frame parts 111*a*, 111*b*, and 112*a*, 112*b* by the bridges. This makes it possible to arrange them with a precise positional accuracy between the piece parts 12*a* to 12*d*, and 22*a* to 22*d* without using a special tool. In addition, the positional accuracy does not change even when the second frame parts (second coupling members) are connected to the piece parts in a later step. Nick lines are set in, for example, a rectangular shape. The dimensions of the rectangle are set with some margins provided around the board main parts 101 and 102 with respect to the outside dimensions (design values). The margins to one sides of the first frame parts 111*a*, 111*b*, and 112*a*, 112*b*, specifically, the long sides thereof to which the second frame parts are to be connected in a later step, are set smaller. This step is executed together with separation of, for example, the other board main parts at the production panel 100. The nick lines may be set in other shapes than a rectangle, such as a parallelogram.

Because severe size accuracy is not demanded at this stage, the board main parts 101 and 102 can be separated easily.

Figure 5:
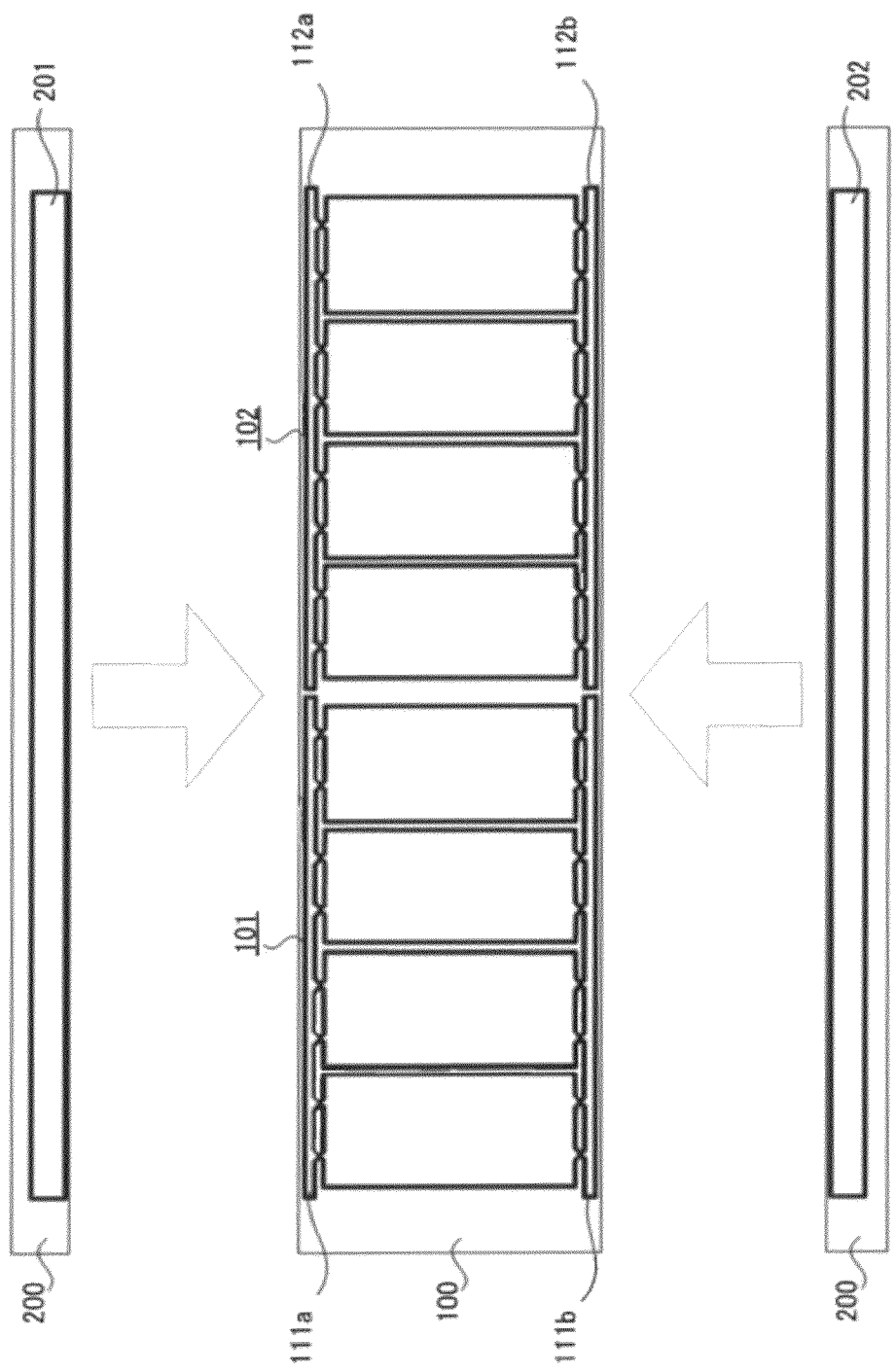
FIG. 5 is a diagram for explaining a step of connecting a second frame part to a first frame part of the board main part.

In next step S14, second frame parts 201, 202 (second coupling members) are connected to the first frame parts 111*a*, 111*b*, and 112*a*, 112*b* of the board main parts 101 and 102, as shown in FIG. 5. The second frame parts 201 and 202 are other portions of the frame parts 11*a* and 11*b* than the first frame parts 111*a*, 111*b*, and 112*a*, 112*b*. The second frame parts 201, 202 can also be produced by cutting a copper clad laminate into a prescribed shape without forming, for example, wirings. This reduces the cost for the material of the frame parts.

Figure 6:
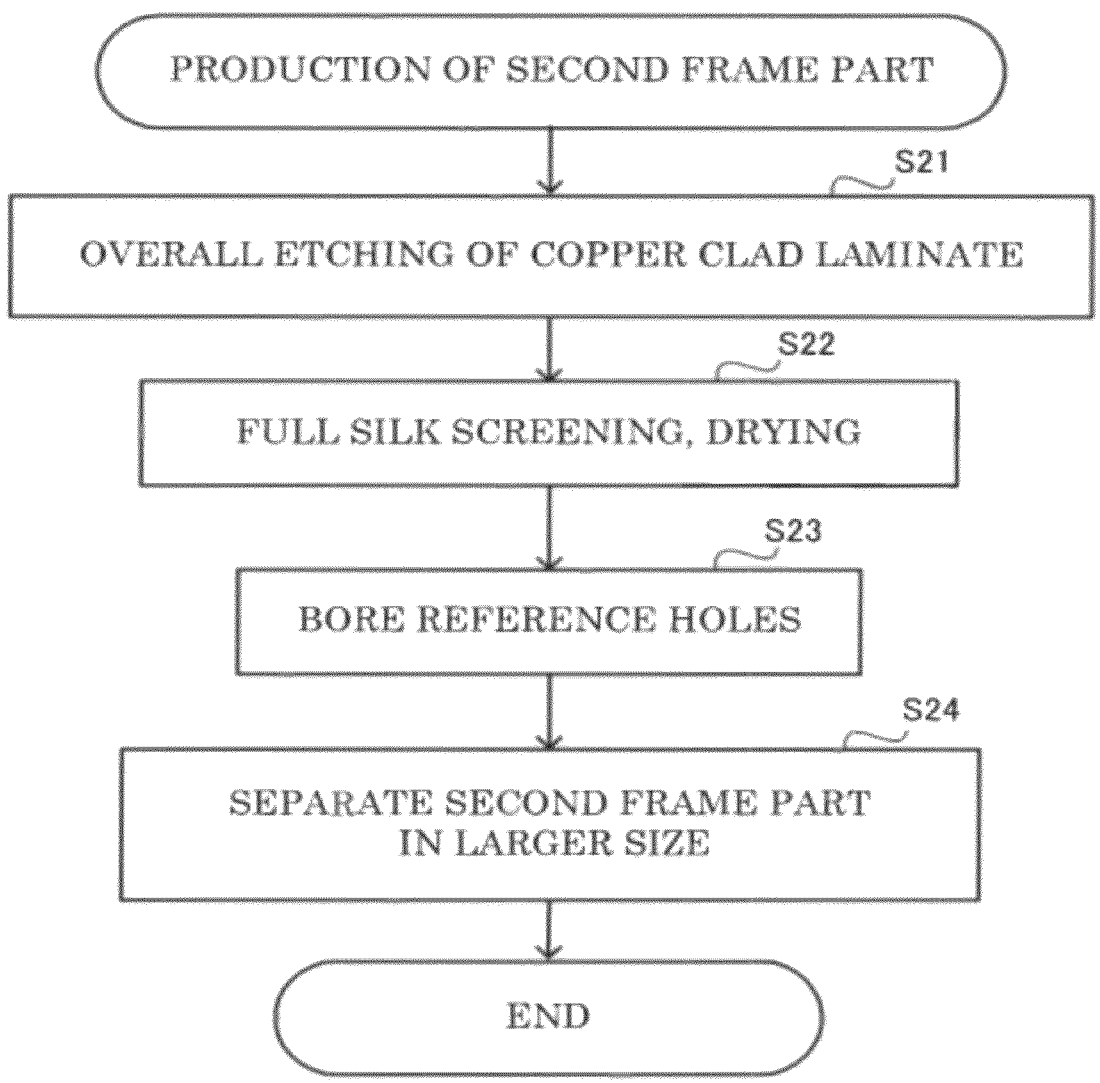
FIG. 6 is a flowchart illustrating procedures of a method of producing the second frame part.
Figure 7:
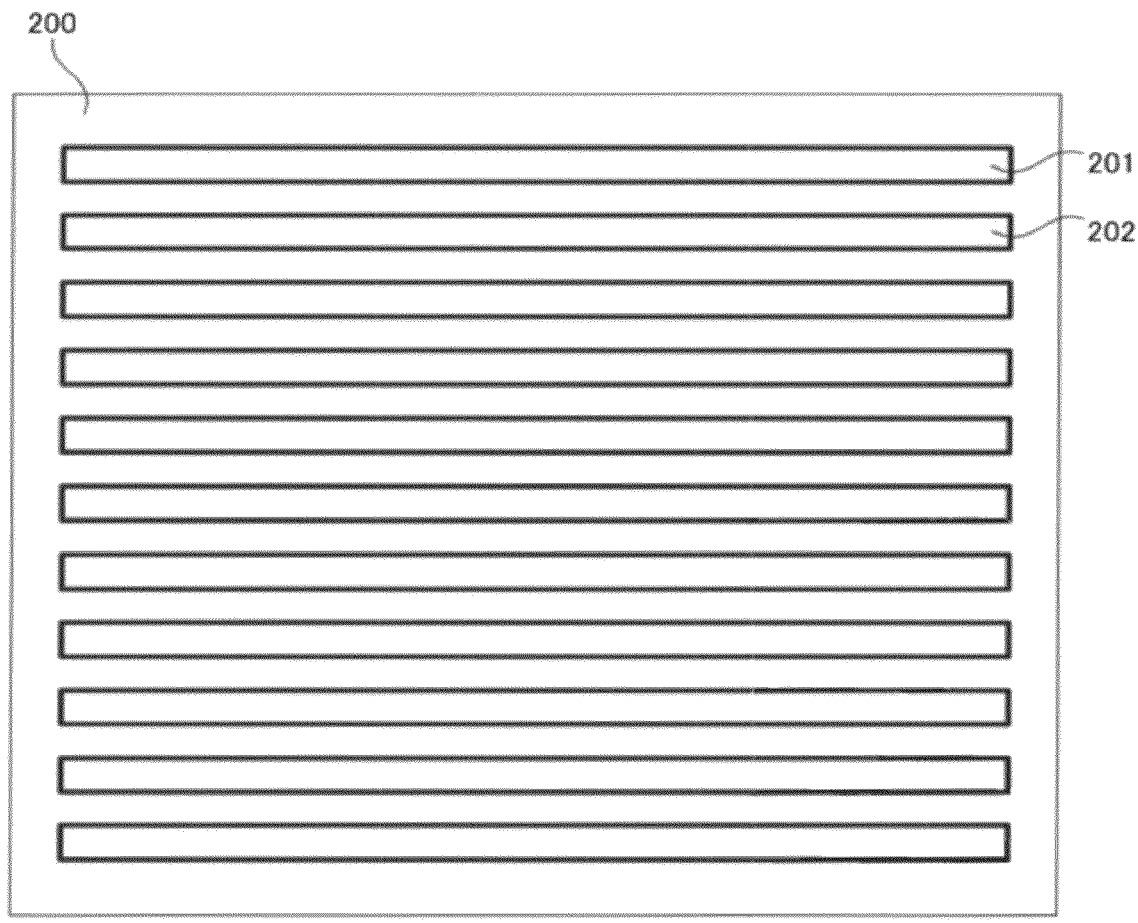
FIG. 7 is a diagram for explaining a step of producing the second frame part at a second production panel.

The second frame parts 201 and 202 can be produced, for example, in a series of processes illustrated in FIG. 6. Through the processing, the second frame parts 201 and 202 are produced at a production panel 200 separate from the production panel 100, as shown in FIG. 7. The production panel 200 is a production panel dedicated for coupling members at which the second frame parts 201 and 202 are produced.

Figure 8:
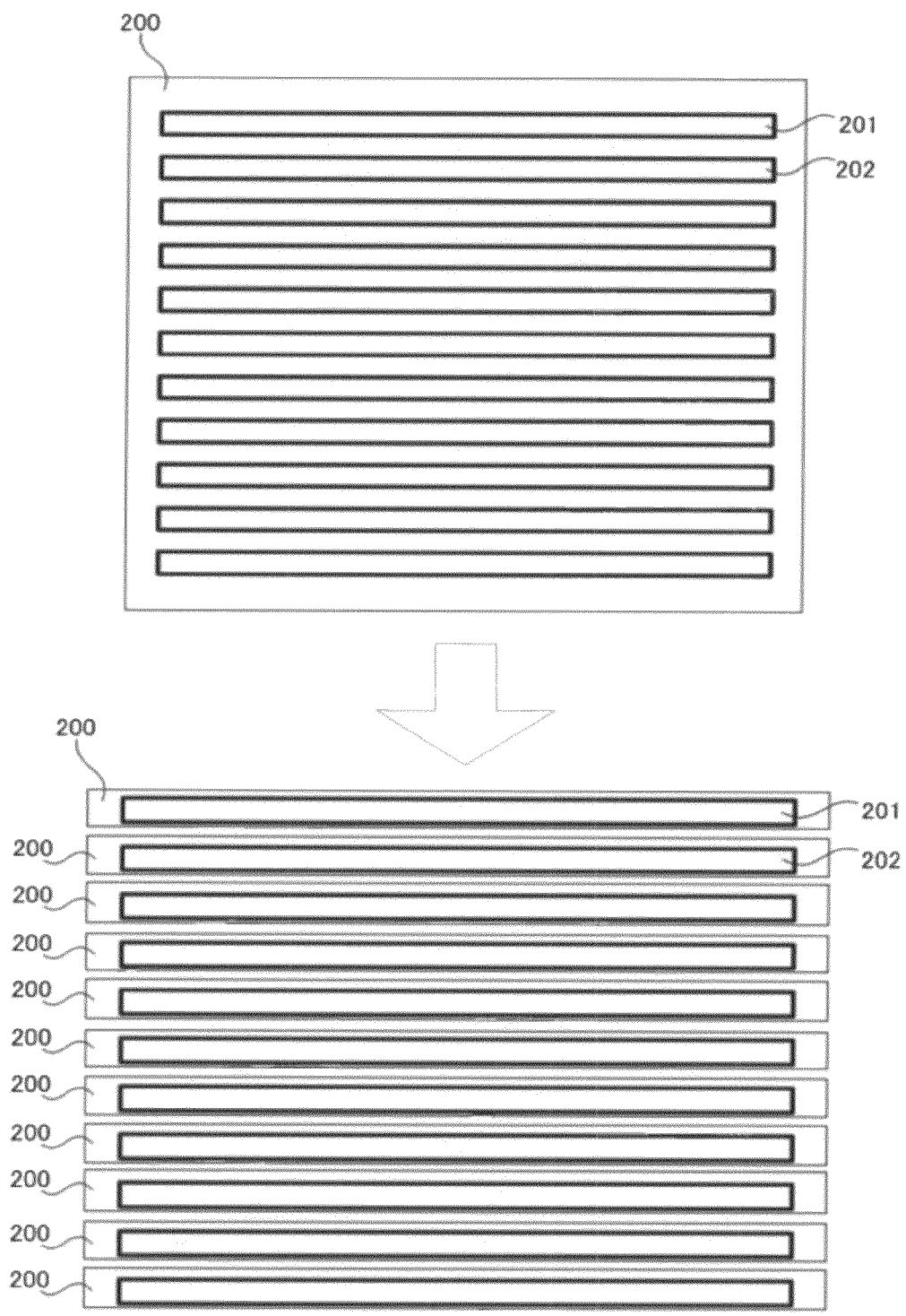
FIG. 8 is a diagram for explaining a step of separating the second frame part from the second production panel.

In the processing in FIG. 6, first, overall etching is performed on the production panel 200 including a copper clad laminate in step S21. In next step S22, an insulating material, such as an epoxy resin, is silk-screened on the entire surface of the production panel 200, and then dried. In next step S23, reference holes (positioning holes) are bored. Next, in step S24, the second frame parts 201 and 202 in sizes larger than outside dimensions (design values) are separated with, for example, a dicing saw, dry saw, a router or the like, as shown in FIG. 8. At this time, nick lines are set in, for example, a rectangular shape. The dimensions of the rectangle are set with some margins provided around the second frame parts 201 and 202 with respect to the outside dimensions (design values). The margins to one sides of the second frame parts 201 and 202, specifically, the long sides thereof which are to be connected to the first frame parts 111a, 111b, and 112a, 112b in step S14 in FIG. 2, are set smaller. The nick lines may be set in other shapes than a rectangle, such as a parallelogram.

Because severe size accuracy is not demanded at this stage, the second frame parts 201 and 202 can be separated easily.

Figure 9A:
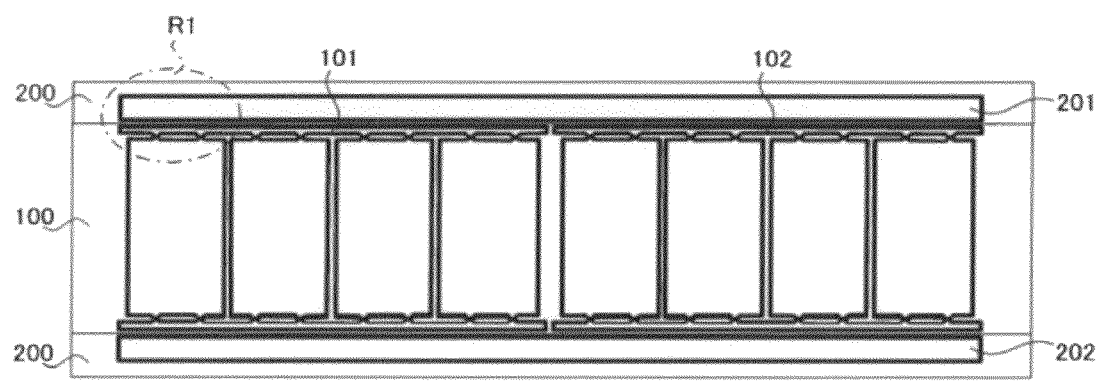
FIG. 9A is a plan view showing the multi-piece board after connection.
Figure 9B:
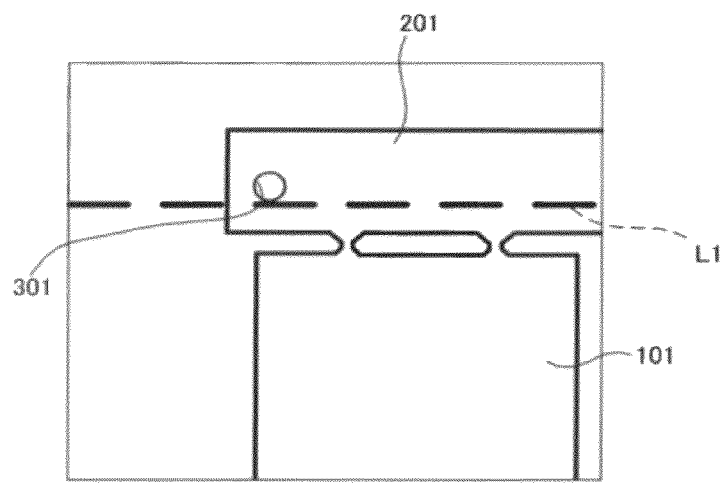
FIG. 9B is a partly enlarged view of FIG. 9A.

In step S14 in FIG. 2, the board main parts 101 and 102 and the second frame parts 201 and 202 are connected (adhered) together using, for example, a heat-hardening epoxy adhesive. At this time, to avoid positional misalignment, they are adhered with the second frame parts 201 and 202 secured by, for example, setting pins in the reference holes (see step S23 in FIG. 6). The epoxy adhesive is hardened as it undergoes a heat treatment in an oven at 100° C. for 20 minutes, for example. As a result, the board main parts 101 and 102 are connected to the second frame parts 201 and 202 as shown in, for example, FIGS. 9A and 9B (enlarged view of a region R1 in FIG. 9A). The multi-piece board 10 as shown in FIG. 1 is thus fabricated. In FIG. 9B, reference numeral "301" is equivalent to the reference hole, and reference numeral "L1" is equivalent to an adhesion line.

In next step S15, the multi-piece board 10 is finished to predetermined outside dimensions (design values) using an ordinary router machine. When there are NTHs (Non-Through Holes) in the frame parts 11a and 11b, the NTHs are formed along with the outline processing. Instead of the ordinary router machine, an alignment router or the like may be used as well.

The final outside dimensions of the multi-piece board 10 are determined by the outline processing in step S15, so that at the time of the adhesion in step S14, it is effective to set the outside dimensions of the first frame parts 11a, 11b, and 112a, 112b and the second frame parts 201, 202 in sizes larger than the design values. This facilitates the position in the adhesion in step S14.

Thereafter, an electrification test is performed on the piece parts 12a to 12d and 22a to 22d. If a defective piece is found in the electrification test, a cut and patch repair is performed to replace the defective piece with a defect-free piece produced separately. The replacement of a defective piece with a defect-free piece repairs the multi-piece board. With such repair, discarding of the whole multi-piece board can be avoided when the multi-piece board becomes partly defective, so that other defect-free pieces will not be wasted. This therefore improves the yield and the number of yielded products. As the electrification test has already been performed in step S12, this electrification test may be omitted according to the purpose or the like.

Through the foregoing processing, the multi-piece board with a collection of only defect-free pieces is formed.

According to the fabrication method, portions (second frame parts) of the frame parts 11a and 11b are produced at the production panel 200 separate from the production panel 100 which is involved in producing board main parts. This makes it possible to produce a larger number of board main parts at the production panel 100, thus improving the yield and the number of yielded products.

According to the fabrication method, those board main parts which are determined as being defect-free in the examination process in step S12 are combined. This eliminates defective pieces beforehand.

According to the fabrication method, the common second frame parts 201, 202 are connected to a plurality of board main parts 101 and 102. The eight piece parts 12a to 12d, and 22a to 22d are distributed to the two board main parts 101 and 102, so that when one piece part is defective, for example, the board main part which does not include the defective piece part need not be discarded. This improves the yield and the number of yielded products.

According to the fabrication method, the second frame parts are produced at the production panel 200. As it is a simple process of producing the second frame parts, the manufacture cost can be reduced.

According to the fabrication method, the board main parts 101 and 102 and the second frame parts 201 and 202 are connected together by a heat-hardening adhesive (e.g., epoxy adhesive). The adhesion can be made more reliable by using the heat-hardening adhesive which has stronger adhesion power than a photo-curing adhesive or the like.

According to the fabrication method, after the board main parts 101 and 102 and the second frame parts 201 and 202 are connected together in step S14, the outline processing thereof is carried out in step S15. The execution of the outline processing after connection can allow positional misalignment, if occurred in the connecting step, to be corrected in the outline processing. This makes it possible to easily provide a higher size accuracy and alignment accuracy as compared with the case of carrying out the outline processing before connection.

Second Embodiment

Figure 10:
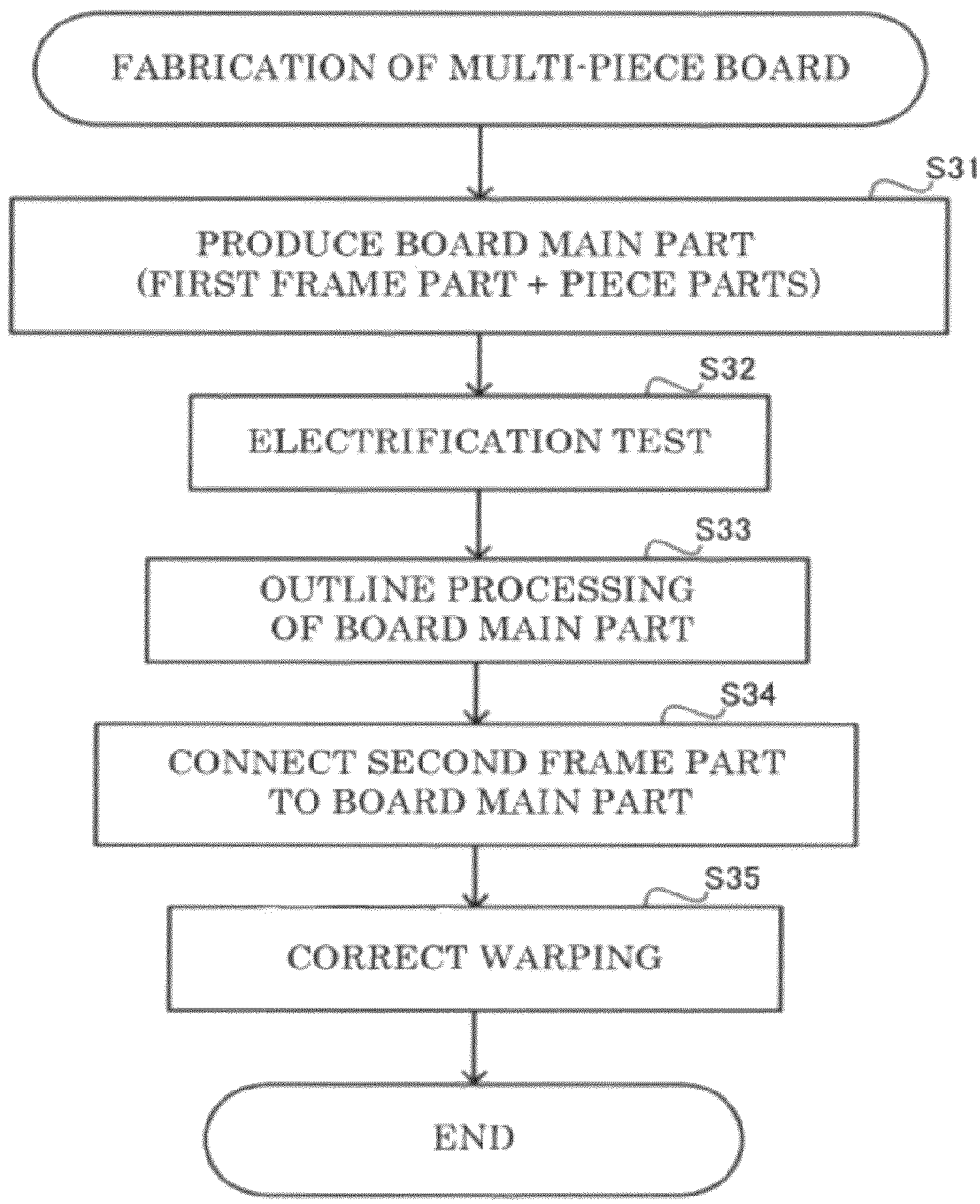
FIG. 10 is a flowchart illustrating procedures of the fabrication method for a multi-piece board according to a second embodiment of the invention.

According to a fabrication method of the second embodiment, outline processing of the board main parts 101 and 102, and the second frame parts 201 and 202 is carried out before connection thereof. Specifically, in case of fabricating the multi-piece board 10 (FIG. 1) by the fabrication method according to the embodiment, for example, in a series of processes illustrated in FIG. 10 are carried out.

Figure 11:
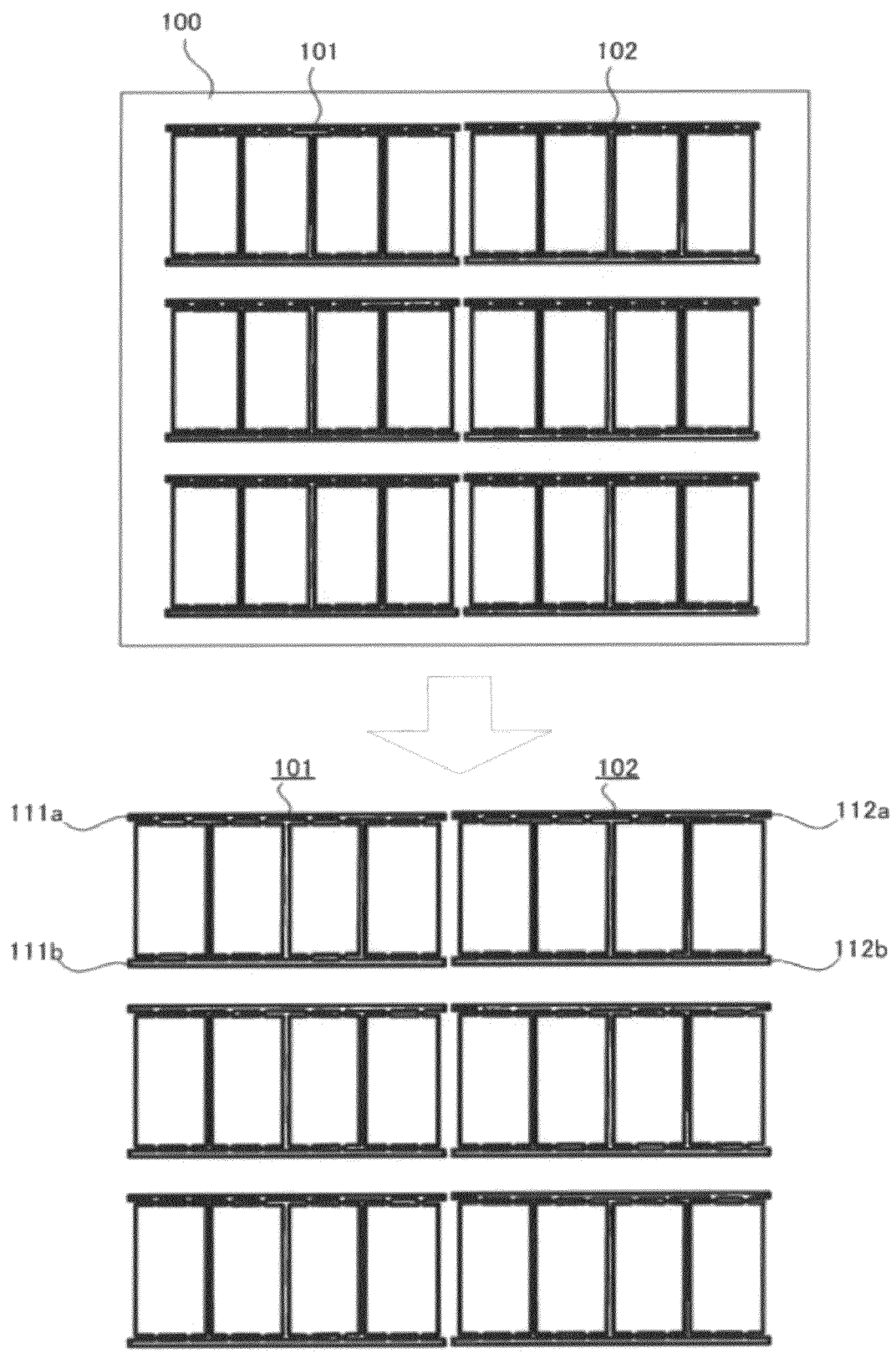
FIG. 11 is a diagram for explaining a step of performing outline processing of a board main part.

First, in step S31, the board main parts 101 and 102, which are a part of the multi-piece board 10, are produced at the production panel 100 as shown in FIG. 11, for example.

Next, in step S32, an electrification test is performed on the board main parts 101 and 102. Any piece part, if determined as being defective in the electrification test, will be corrected or discarded. In later steps, those piece parts which are determined as defect-free will be used. The defective piece parts are replaced with defect-free pieces supplied from, for example, another board main part.

In next step S33, the board main parts 101 and 102 in predetermined outside dimensions (design values) are separated with an ordinary router machine (router having no alignment capability) as shown in FIG. 11, for example. That is, the outline processing of the board main parts 101 and 102 is carried out. An alignment router or the like may be used in place of the ordinary router machine.

Figure 12:
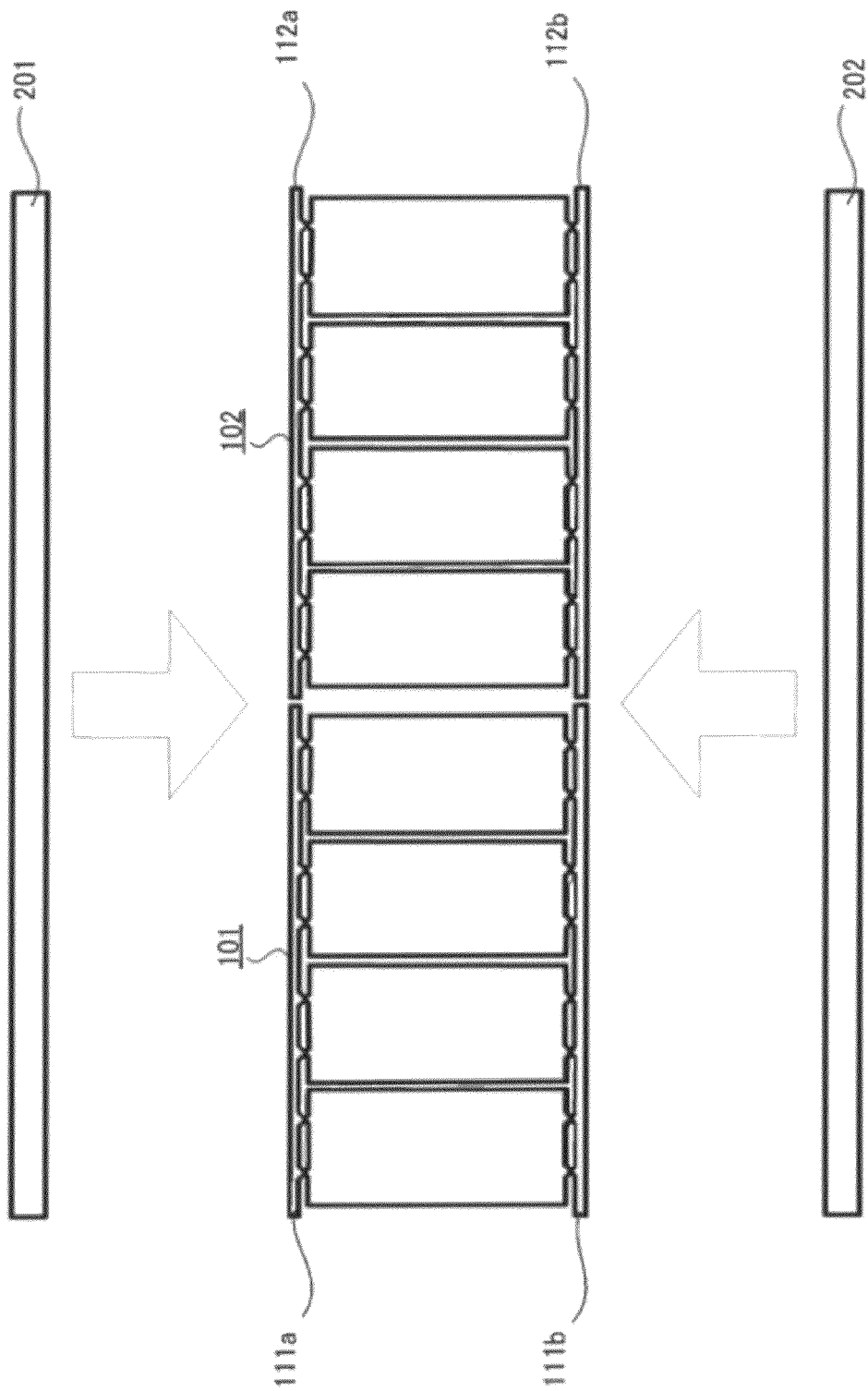
FIG. 12 is a diagram for explaining a step of connecting a second frame part to a first frame part of the board main part.

In next step S34, the second frame parts 201 and 202 are connected to the first frame parts 111a, 111b, and 112a, 112b of the board main parts 101 and 102 as shown in FIG. 12.

Figure 13:
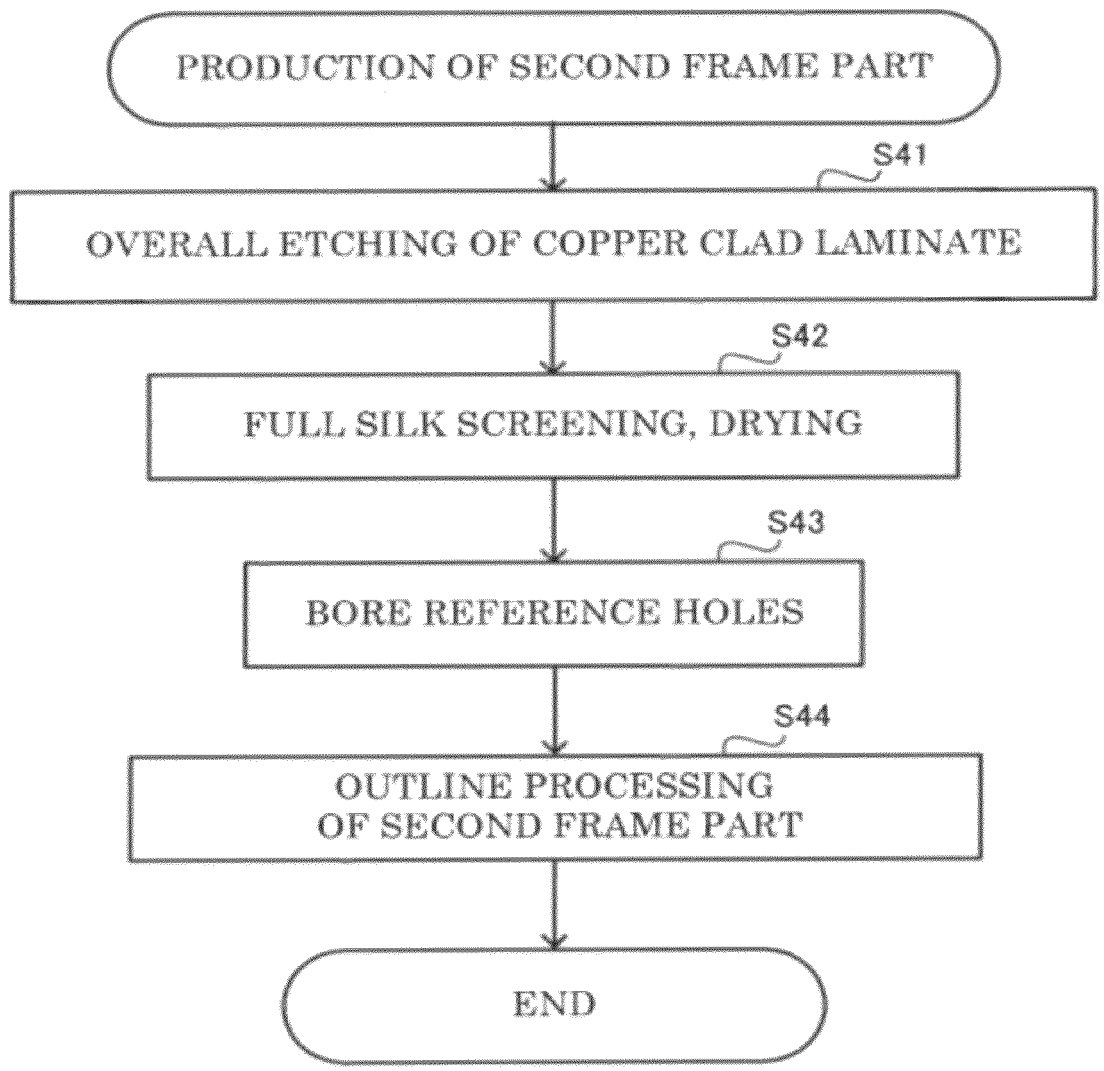
FIG. 13 is a flowchart illustrating procedures of a method of producing the second frame part.
Figure 14:
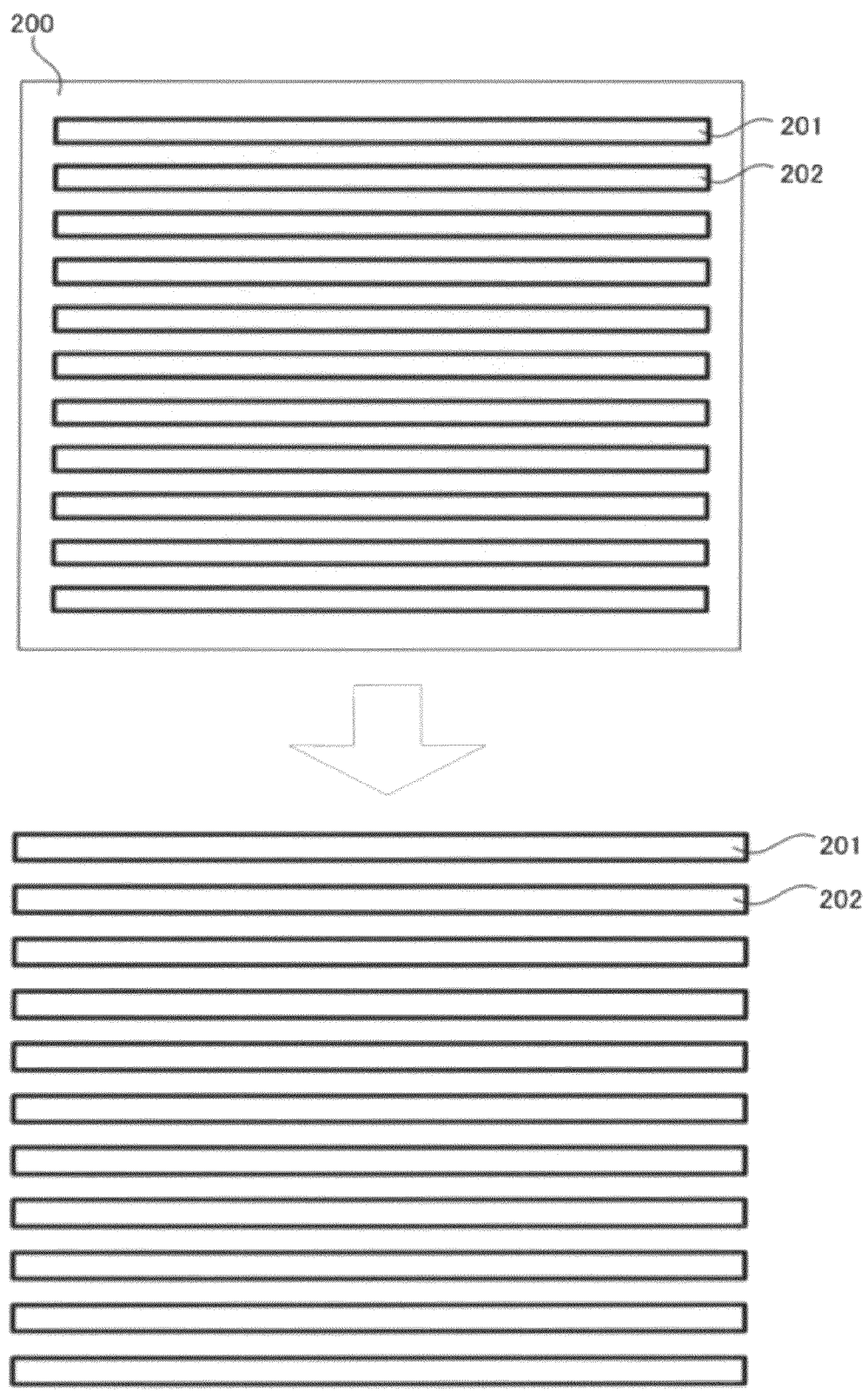
FIG. 14 is a diagram for explaining a step of performing outline processing of the second frame part.

The second frame parts 201 and 202 can be produced, for example, in a series of processes illustrated in FIG. 13. Through the processing, the second frame parts 201 and 202 are produced at the production panel 200 as shown in FIG. 14.

The production panel 200 is a production panel dedicated for coupling members at which the second frame parts 201 and 202 are produced.

In the processing in FIG. 13, first, overall etching is performed on the production panel 200 including a copper clad laminate in step S41. In next step S42, an insulating material, such as an epoxy resin, is silk-screened on the entire surface of the production panel 200, and then dried. In next step S43, reference holes (positioning holes) are bored. Next, in step S44, the second frame parts 201 and 202 in predetermined outside dimensions (design values) are separated with, for example, an ordinary router machine, as shown in FIG. 14. That is, the outline processing of the second frame parts 201 and 202 is carried out. An alignment router or the like may be used in place of the ordinary router machine.

Figure 15:
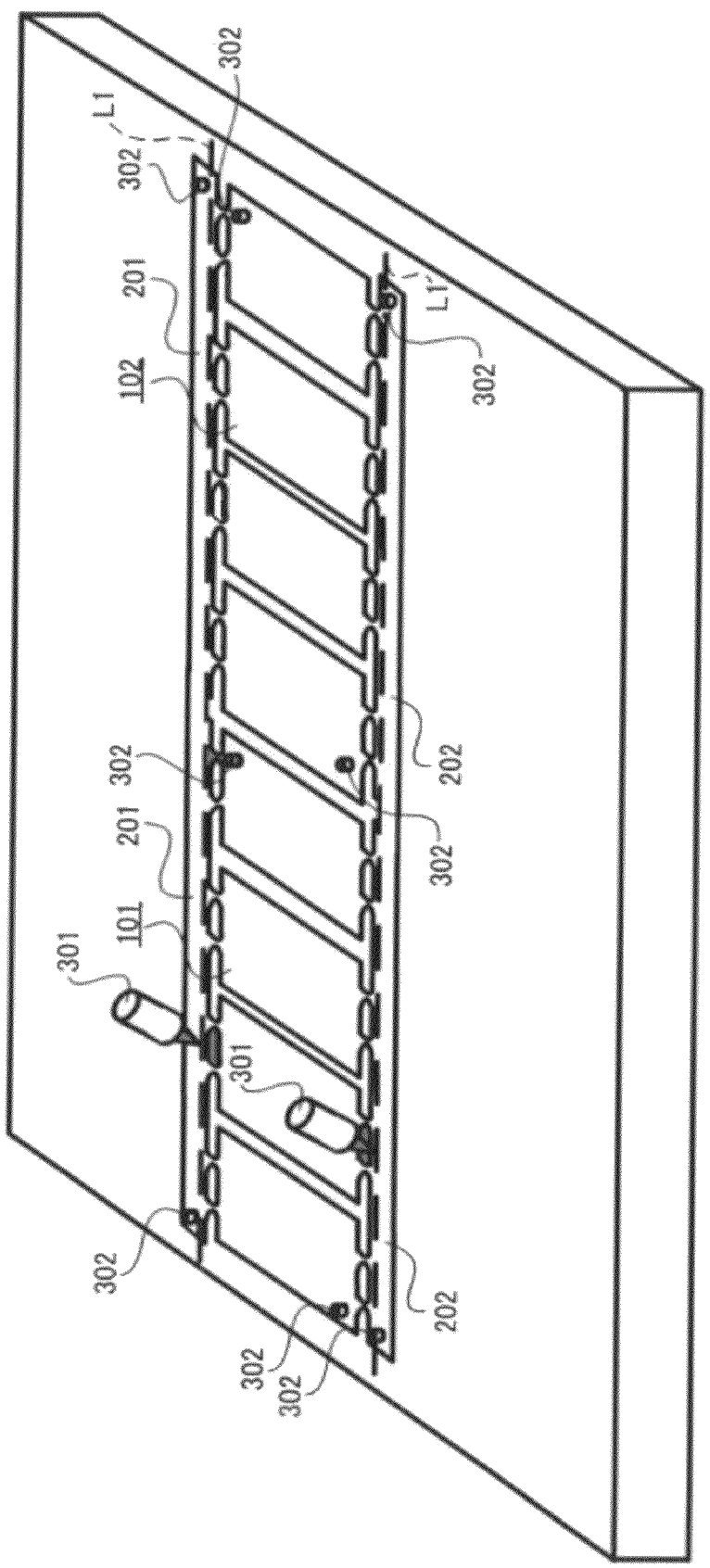
FIG. 15 is a diagram for explaining a step of connecting the second frame part to the first frame part of the board main part.
Figure 16:
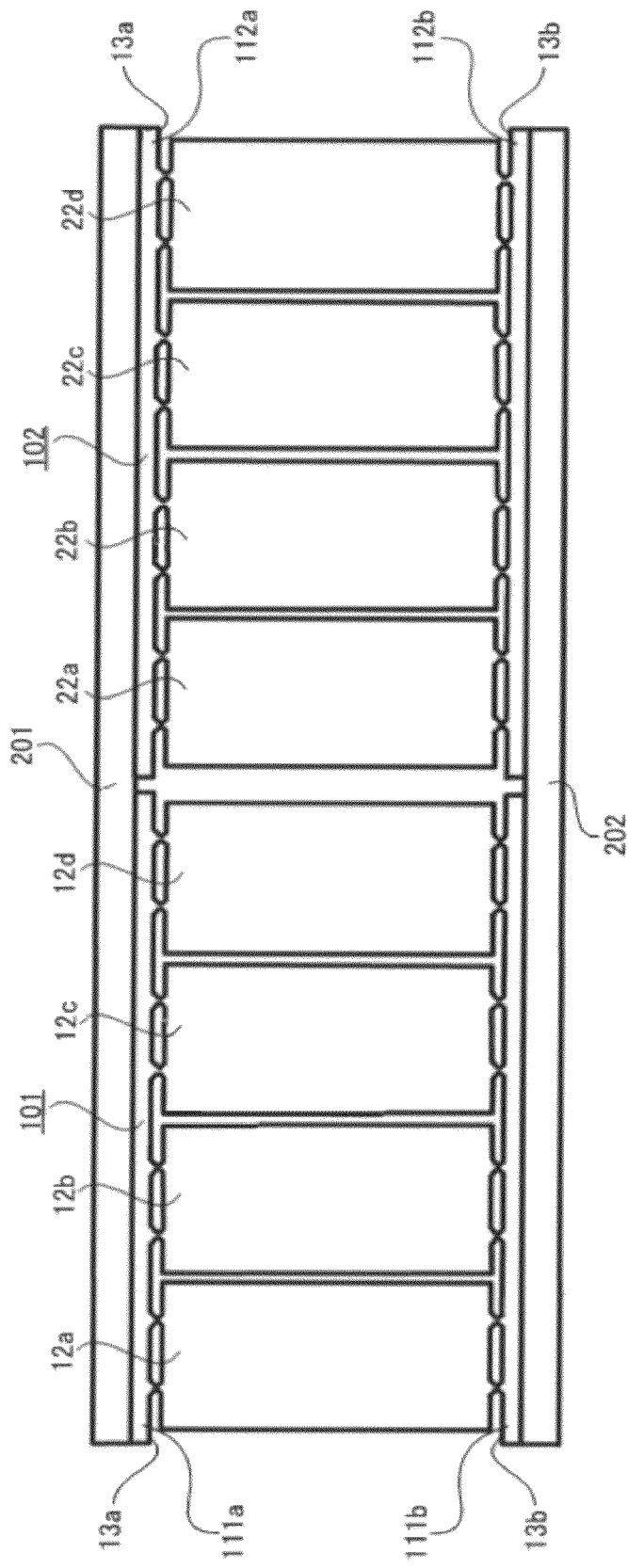
FIG. 16 is a plan view showing the multi-piece board after connection.

In step S34 in FIG. 10, the board main parts 101 and 102 and the second frame parts 201 and 202 are connected (adhered) together at an adhesion line L1 using, for example, a heat-hardening epoxy adhesive 301 as shown in FIG. 15. At this time, to avoid positional misalignment, they are adhered with the board main parts 101 and 102, and the second frame parts 201 and 202 secured by, for example, setting pins 302 in the reference holes. The applied adhesive paste is subjected to a heat treatment in an oven at 100° C. for 20 minutes, for example, to be hardened. As a result, the board main parts 101 and 102 are connected to the second frame parts 201 and 202 as shown in, for example, FIG. 16. The multi-piece board 10 as shown in FIG. 1 is thus fabricated.

In next step S35, the warping of the board is corrected. Thereafter, an electrification test is performed on the piece parts 12a to 12d as needed. If a defective piece is found in the electrification test, a cut and patch repair is performed to replace the defective piece with a defect-free piece produced separately.

Through the foregoing processing, the multi-piece board with a collection of defect-free pieces is formed.

According to the fabrication method, as in the first embodiment, portions (second coupling members) of the frame parts 11a and 11b are produced at another production panel 200 separate from the production panel 100 which is involved in producing board main parts. This makes it possible to produce a larger number of board main parts at the production panel 100, thus improving the yield and the number of yielded products.

Although the multi-piece boards and the fabrication methods according to the embodiments of the invention are described above, the invention is not limited to the embodiments.

Other Embodiments

Figure 17:
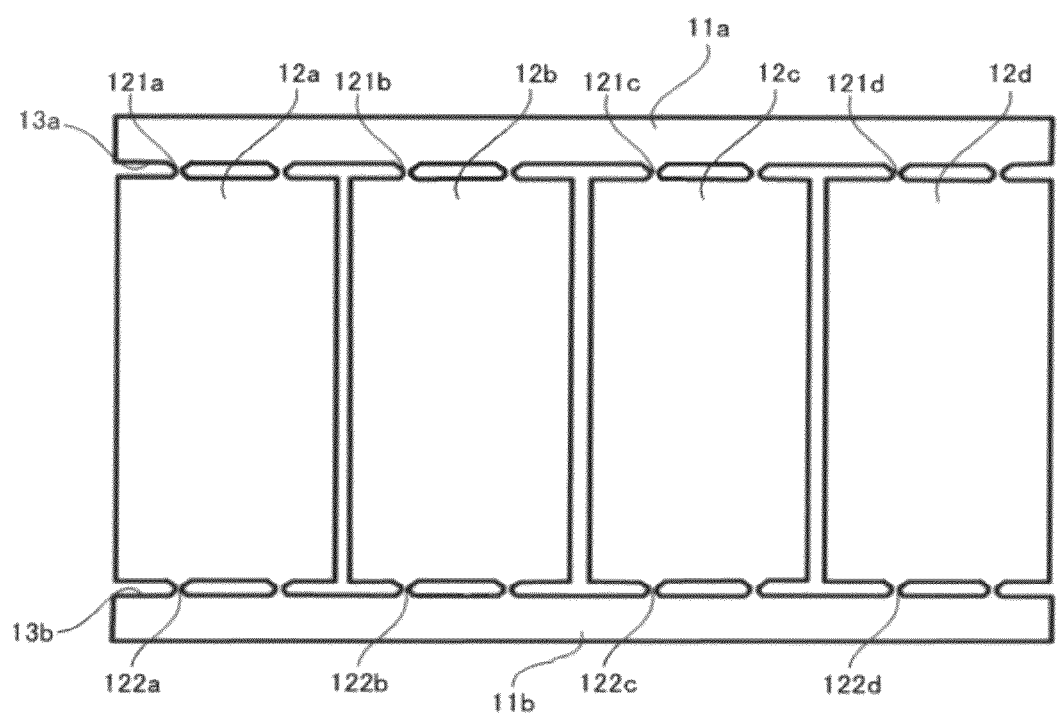
FIG. 17 is a diagram showing another example of the multi-piece board to be fabricated.

The fabrication target is not limited to the multi-piece board 10 shown in FIG. 1, and a multi-piece board can be fabricated according to the purpose or the like. For example, the board main parts 101 and 102 each having four piece parts are combined into the multi-piece board 10 shown in FIG. 1 in the embodiments, which is not restrictive. As shown in FIG. 17, for example, the fabrication target may be a multi-piece board 10 having one board main part 101. Further, three or more board main parts may be combined into a multi-piece board. In addition, the number of piece parts a single board main part has is optional.

In the adhesion step, an adhesive other than a heat-hardening adhesive may be used. For example, a non-heat-hardening adhesive, such as a photo-curing adhesive or two-component type acrylic adhesive, can be used. The non-heat-hardening adhesive is an adhesive whose hardening does not require a heat treatment. The photo-curing adhesive is an adhesive which is hardened by irradiation of electromagnetic waves, such as ultraviolet rays, visible rays. The non-heat-hardening adhesive can suppress a change (cure shrinkage or the like) in the shape of the board originating from a temperature change. For example, a UV (UltraViolet rays) curing adhesive and an acrylic adhesive or the like are effective as a non-heat-hardening adhesive.

However, the non-heat-hardening adhesive has lower adhesion power than the heat-hardening adhesive. In this respect, after adhesion with a non-heat-hardening adhesive (temporal attachment), for example, the temporarily-attached portions may be reinforced by, for example, a heat-hardening adhesive. The temporal attachment with the non-heat-hardening adhesive beforehand can suppress a change (cure shrinkage or the like) in the shape of the board originating from a temperature change at the time of performing a heat treatment to harden the heat-hardening adhesive. Further, the reinforcement with the heat-hardening adhesive having high adhesion power can ensure surer adhesion.

Figure 18:
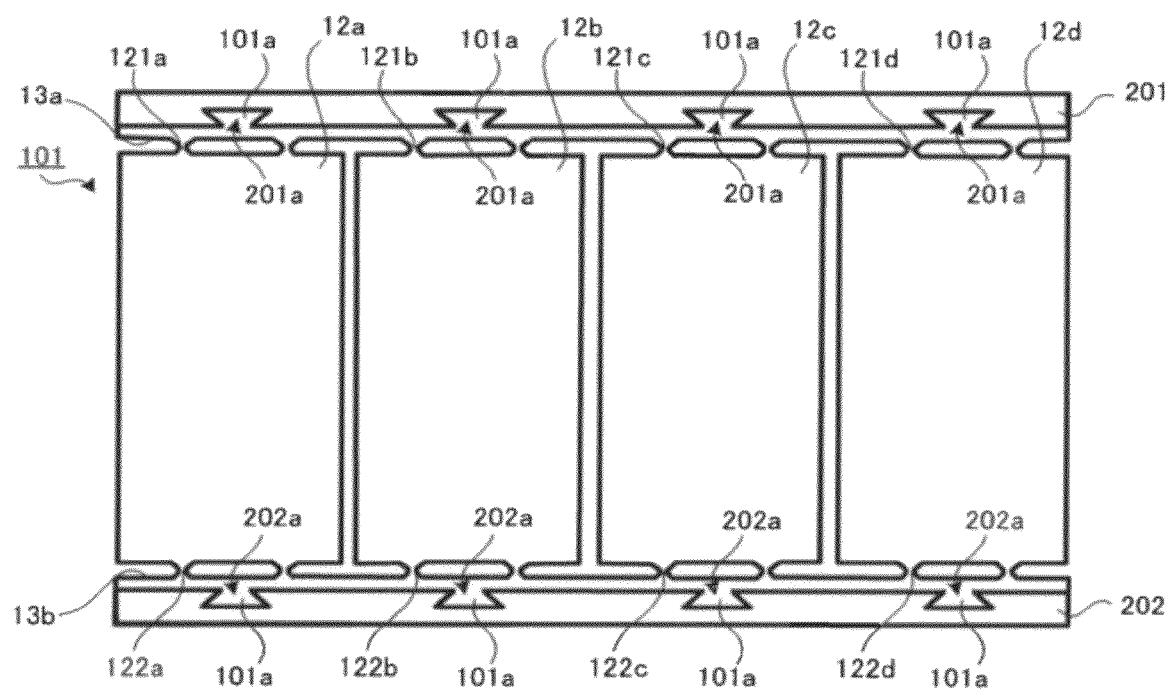
FIG. 18 is a diagram showing one example of a multi-piece board whose board main part is coupled to the second frame part by a fitting portion.

Fitting portions to couple the board main part and the second frame part may be formed. As shown in FIG. 18, for example, claw receiving portions 201a and 202a may be formed at the second frame parts 201 and 202, and fitting claws 101a to be fitted in the claw receiving portions 201a and 202a may be formed at the board main part 101. In this case, the fitting claws 101a are manually fitted into the claw receiving portions 201a and 202a in the adhesion step. Thereafter, flattening of the joint portions, or the like is carried out as needed. This causes the board main part 101 and the second frame parts 201 and 202 to be connected together by the fitting-originated frictional force. If a sufficient connection strength is obtained, therefore, both parts may be adhered (reinforced) with a non-heat-hardening adhesive alone without using a heat-hardening adhesive. The elimination of a heat-hardening adhesive, if possible, can suppress a change (cure shrinkage or the like) in the shape of the board originating from a temperature change.

Figure 19A:
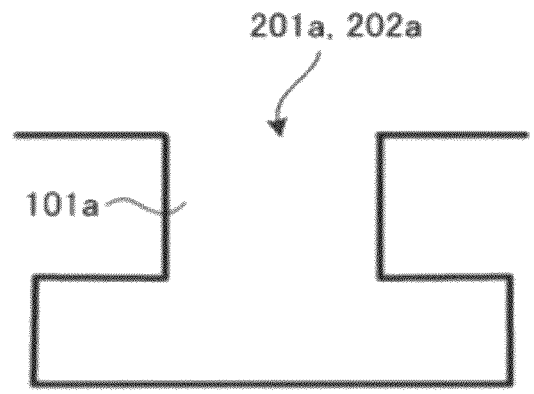
FIG. 19A is a diagram showing another example of the shape of a fitting portion.
Figure 19B:
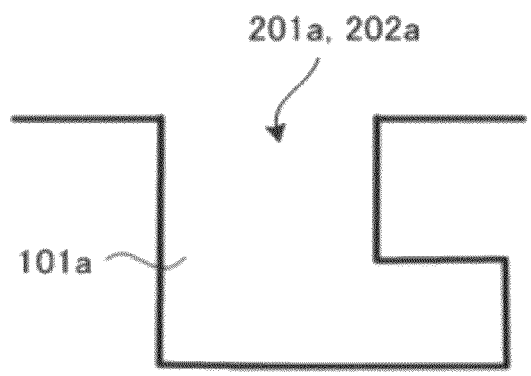
FIG. 19B is a diagram showing a further example of the shape of a fitting portion.
Figure 19C:
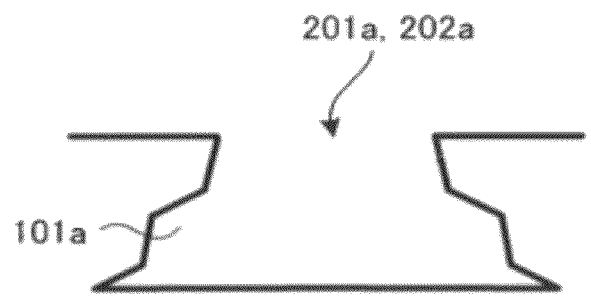
FIG. 19C is a diagram showing a still further example of the shape of a fitting portion.

While FIG. 18 exemplifies trapezoidal fitting claws 101a which expand toward the fitting mates, the shapes of the fitting claws 101a and the respective claw receiving portions 201a and 202a are not limited to this trapezoidal shape. As shown in FIG. 19A or 19B, for example, the fitting claws 101a may be formed in a T shape or an L shape. To increase the contact areas with the claw receiving portions 201a and 202a, the sides of the fitting claws 101a may be formed in a zigzag pattern, for example, as shown in FIG. 19C. The shape of the fitting portions is basically optional. It is however preferable that the fitting portion should have such a shape that when one of multiple parts is stretched in parallel to the major surface of the board to firmly connect the parts, the fitting portion is caught at another part so that the one part does not come off the another part.

The number of the fitting portions (fitting claws and claw receiving portions) is optional. The larger the number of the fitting claws and the number of the claw receiving portions become, the stronger the connection strength (fixation) becomes, which makes the production difficult.

The sequential order of the processes in the embodiments is not limited to those illustrated in the flowcharts, and can be changed arbitrarily without departing from the scope and spirit of the invention. Further, some processes may be omitted according to the purpose or the like.

The production panel at which the second frame parts are produced is not limited to a production panel dedicated for coupling members. For example, the second frame parts may be produced together with other components than the frame parts, such as piece parts, according to the purpose or the like.

The materials and sizes of the individual layers, the number of the layers, and so forth can be changed in the embodiments.

Obviously, numerous modifications and variations of the present invention are possible in light of the above teachings. It is therefore to be understood that within the scope of the appended claims, the invention may be practiced otherwise than as specifically described herein.

What is claimed is:

1. A multi-piece board comprising:
   a board main part having a first frame element and a plurality of wiring board piece portions connected to the first frame element; and
   a second frame element adhered to the board main part through the first frame element of the board main part such that the second frame element and the first frame element of the board main part form a frame device.

2. The multi-piece board according to claim 1, wherein the second frame element and the first frame element of the board main part are adhered each other by an adhesive.

3. The multi-piece board according to claim 1, wherein the first frame element has a first fitting portion, the second frame element has a second fitting portion configured to be fitted to the first fitting portion, and the first frame element and the second frame element are connected to each other by fitting the first fitting portion and the second fitting portion together.

4. The multi-piece board according to claim 1, wherein the board main part has the first frame element in a pair and the plurality of wiring board piece portions connected to the pair of first frame elements such that one ends of the wiring board piece portions are connected to one of the first frame elements and the opposite ends of the wiring board piece portions are connected to the other one of the first frame elements, and the second frame element is formed in a pair such that the pair of second frame elements is attached to the board main part through the pair of first frame elements of the board main part in a space between the pair of second frame elements.

5. The multi-piece board according to claim 1, wherein the board main part has the first frame element in a pair and the plurality of wiring board piece portions connected to the pair of first frame elements such that one ends of the wiring board piece portions are connected to one of the first frame elements and the opposite ends of the wiring board piece portions are connected to the other one of the first frame elements.

6. The multi-piece board according to claim 1, wherein the board main part is provided in a plurality, and the second frame element adhered to the plurality of board main parts through the first frame element of each of the board main parts such that the second frame element and the first frame element of each of the board main parts form a frame device.

7. The multi-piece board according to claim 6, wherein each of the board main parts has the first frame element in a pair and the plurality of wiring board piece portions connected to the pair of first frame elements such that one ends of the wiring board piece portions are connected to one of the first frame elements and the opposite ends of the wiring board piece portions are connected to the other one of the first frame elements, and the second frame element is formed in a pair such that the pair of second frame elements is attached to the board main parts through the pair of first frame elements of each of the board main parts in a space between the pair of second frame elements.

8. A method for fabricating a multi-piece board, comprising:
   preparing a board main part having a first frame element and a plurality of wiring board piece portions connected to the first frame element;
   preparing a second frame element configured to attach the board main part through the first frame element of the board main part such that the second frame element and the first frame element of the board main part form a frame device; and
   adhering the second frame element to the first frame element of the board main part such that a multi-piece board having the board main part attached to the frame device is formed.

9. The method according to claim 8, further comprising outline processing the board main part and the second frame element.

10. The method according to claim 9, wherein the outline processing is carried out with a router.

11. The method according to claim 8, further comprising:
    testing the plurality of wiring board piece portions in the board main part for a defective wiring piece portion,
    wherein the adhering comprising adhering the board main part which is determined to be fee of the defective wiring piece portion to the second frame element.

12. The method according to claim 8, wherein the preparing of the board main part comprises preparing the board main part having the first frame element in a pair and the plurality of wiring board piece portions connected to the pair of first frame elements such that one ends of the wiring board piece portions are connected to one of the first frame elements and the opposite ends of the wiring board piece portions are connected to the other one of the first frame elements, the preparing of the second frame element comprises preparing the second frame elements in a pair such that the pair of second frame elements is configured to attach the board main part through the pair of first frame elements of each of the board main parts in a space between the pair of second frame elements.

13. The method according to claim 1, wherein the preparing of the second frame element comprises producing the second frame element at a production panel which produces the frame element in a plurality.

14. The method according to claim 8, further comprising separating the board main part from a production panel.

15. The method according to claim 8, further comprising separating the second frame element from a production panel.

16. The method according to claim 8, wherein the first frame element of the board main part and the second frame element are adhered by an adhesive in the adhering.

17. The method according to claim 8, wherein the first frame element has a first fitting portion, the second frame element has a second fitting portion configured to be fitted to the first fitting portion, and the first frame element is connected to the second frame element by fitting the first fitting portion and the second fitting portion together.

18. The method according to claim 8, wherein the preparing of the board main part comprises preparing the board main part having the first frame element in a pair and the plurality of wiring board piece portions connected to the pair of first frame elements such that one ends of the wiring board piece portions are connected to one of the first frame elements and the opposite ends of the wiring board piece portions are connected to the other one of the first frame elements.

19. The method according to claim 8, wherein the preparing of the board main part comprises preparing the board main part in a plurality, the preparing of the second frame element comprises preparing the second frame configured to attach the plurality of board main parts through the first frame element of each of the board main parts such that the second frame element and the first frame element of each of the board main parts form a frame device, and the adhering of the second frame element comprises adhering the second frame element to the first frame element of each of the board main parts such that a multi-piece board having the plurality of board main parts attached to the frame device is formed.

20. The method according to claim 19, wherein the preparing of the board main parts comprises preparing the plurality of board main parts each having the first frame element in a pair and the plurality of wiring board piece portions connected to the pair of first frame elements such that one ends of the wiring board piece portions are connected to one of the first frame elements and the opposite ends of the wiring board piece portions are connected to the other one of the first frame elements, the preparing of the second frame element comprises preparing the second frame element in a pair such that the pair of second frame elements is configured to attach the board main parts through the pair of first frame elements of each of the board main parts in a space between the pair of second frame elements.

* * * * *